(12) United States Patent
Chen

(10) Patent No.: US 7,729,133 B2
(45) Date of Patent: Jun. 1, 2010

(54) SECONDARY SIDE-DRIVEN HALF-BRIDGE POWER SUPPLY

(75) Inventor: Chang Hsing Chen, Taipei (TW)

(73) Assignee: Solytech Enterprise Corporation, Taipei (TW)

( * ) Notice: Subject to any disclaimer, the term of this patent is extended or adjusted under 35 U.S.C. 154(b) by 284 days.

(21) Appl. No.: 11/964,662

(22) Filed: Dec. 26, 2007

(65) Prior Publication Data

US 2009/0167081 A1   Jul. 2, 2009

(51) Int. Cl.
*H02M 3/335* (2006.01)

(52) U.S. Cl. .............................. 363/16; 363/17; 363/22; 363/23

(58) Field of Classification Search .................... 363/16, 363/17, 18, 19, 22, 23
See application file for complete search history.

(56) References Cited

U.S. PATENT DOCUMENTS 5,864,472 A * 1/1999 Peterson ...................... 363/18

6,370,040 B2 * 4/2002 Hosotani et al. .............. 363/19

FOREIGN PATENT DOCUMENTS

JP   2003-511004   * 3/2003

\* cited by examiner

*Primary Examiner*—Bao Q Vu
(74) *Attorney, Agent, or Firm*—Ming Chow; Sinorica, LLC

(57) ABSTRACT

The present invention discloses a secondary side-driven half-bridge power supply, which has a half-bridge transformer. A MOSFET unit is connected to the primary side of the half-bridge transformer, and an output rectifier/filter circuit connected to the secondary side of the half-bridge transformer. In the present invention, a PWM controller generates a control signal and sends the signal to a separating element. The control signal is used to drive the MOSFET unit, and the MOSFET unit then drives the half-bridge transformer. The output rectifier/filter circuit processes the signal output by the half-bridge transformer to provide voltages for external loads. The present invention can increase the power efficiency, raise the working frequency, and reduce the cost.

7 Claims, 7 Drawing Sheets

US 7,729,133 B2

SECONDARY SIDE-DRIVEN HALF-BRIDGE POWER SUPPLY

BACKGROUND OF THE INVENTION

1. Field of the Invention

The present invention relates to a power supply, particularly to a secondary side-driven half-bridge power supply.

2. Description of the Related Art

In the current power supply industry, the switched-mode power supply usually adopts a half-bridge power source circuit because the induction magnetic field can work in the first and third quadrants under the half bridge architecture. The forward type or flyback type architecture can only work in the first quadrant. Therefore, the half-bridge power source circuit has a much higher efficiency.

In the current power supply industry, the PWM (Pulse Width Modulation) controller is often arranged on the secondary side. A separating element is used to amplify a small duty-cycle signal waveform, and the amplified signal is used to drive power transistors on the primary side and then drive a half-bridge transformer. Refer to FIG. 1. The power transistors 10 are usually formed of two bipolar junction transistors. During the switching activities of a bipolar junction transistor, the current usually flows through a transistor area, and power is thus consumed therein. When the switching frequency of a power supply is increased, the performance of bipolar junction transistors is further degraded. Besides, the current semiconductor industry lays stress on the fabrication of metal oxide semiconductor field effect transistors; the bipolar junction transistors are obsolescing and will no more play an important role in the future technology.

Accordingly, the present invention proposes a half-bridge power supply to overcome the abovementioned problems.

SUMMARY OF THE INVENTION

The primary objective of the present invention is to provide a secondary side-driven half-bridge power supply, which has higher power efficiency than the conventional technologies.

Another objective of the present invention is to provide a secondary side-driven half-bridge power supply, wherein the switching frequency can be increased.

To achieve the abovementioned objectives, the present invention proposes a secondary side-driven half-bridge power supply, which has a MOSFET (Metal Oxide Semiconductor Field Effect Transistor) unit. The MOSFET unit is connected to the primary side of a half-bridge transformer. A PWM (Pulse Width Modulation) controller is connected to the secondary side of the half-bridge transformer and generates a control signal. A separating element receives the control signal to drive the MOSFET unit, and the MOSFET unit then drives the half-bridge transformer. An output rectifier/filter circuit is connected to the half-bridge transformer and arranged on the secondary side. The output rectifier/filter circuit processes the signal output by the half-bridge transformer to provide voltages for external loads.

Below, the embodiments are described in detail in cooperation with the attached drawings to make easily understood the objectives, technical contents, characteristics and accomplishments of the present invention.

BRIEF DESCRIPTION OF THE DRAWINGS

FIGS. 7-1 to FIGS. 7-4 are diagrams schematically showing all parts circuits of a circuit wherein the present invention is applied to a switched-mode power supply.

DETAILED DESCRIPTION OF THE INVENTION

Figure 1:
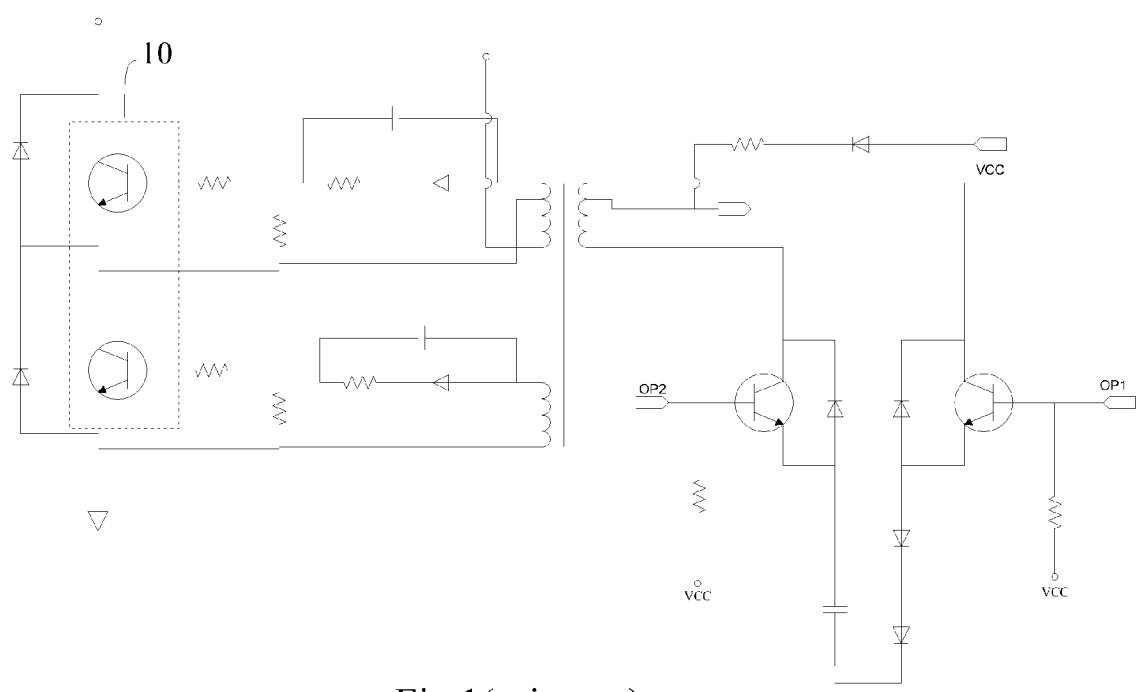
FIG. 1 is a diagram schematically showing a drive circuit of a conventional power supply.
Figure 2:
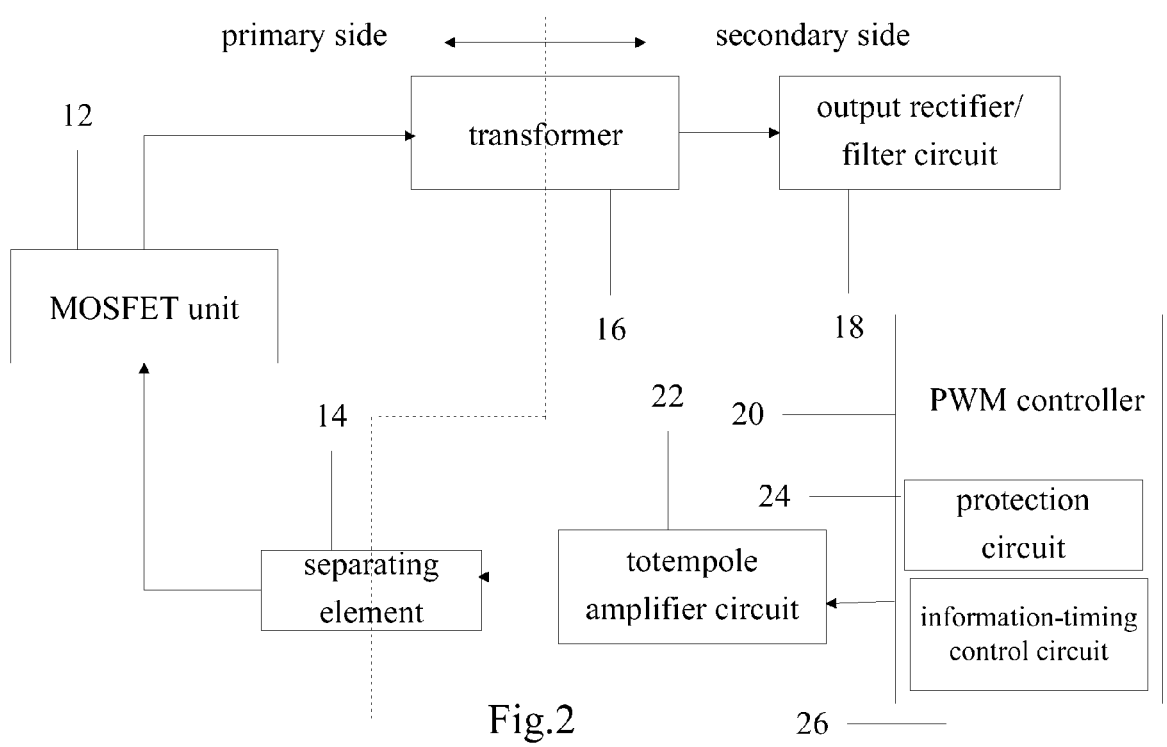
FIG. 2 is a diagram schematically showing a circuit of a power supply according to the present invention.

Refer to FIG. 2 and FIGS. 7-1 to FIGS. 7-4 respectively a diagram schematically showing a circuit of a power supply according to the present invention and a diagram schematically showing all parts circuits of a circuit wherein the present invention is applied to a switched-mode power supply. As shown in the drawings, an output rectifier/filter circuit 18 is connected to a half-bridge transformer 16, arranged on the secondary side of the half-bridge transformer 16 and used to provide voltages for the external loads. A MOSFET (Metal Oxide Semiconductor Field Effect Transistor) unit 12 is connected to the other end of the half-bridge transformer 16, arranged on the primary side of the half-bridge transformer 16 and used to drive the half-bridge transformer 16. The other end of the MOSFET unit 12 is connected to a separating element 14, and the separating element 14 is used to separate the primary side and the secondary side. A totempole amplifier circuit 22 is connected to the other end of the separating element 14. A PWM (Pulse Width Modulation) controller 20 is arranged on the secondary side, connected to the other end of the totempole amplifier circuit 22 and used to generate a control signal. The totempole amplifier circuit 22 amplifies the control signal. The amplified signal is received by the separating element 14 and used to drive the MOSFET unit 12. The PWM controller 20 further comprises: a protection circuit 24 and an information-timing control circuit 26. A voltage-feedback control circuit 28 is connected to the output rectifier/filter circuit 18 and the PWM controller 20 and used to modulate and balance the output voltage and the control signal. An independent power control circuit 30 provides an independent power source for the external loads so that the loads can keep on running when all the other portions of the system are shut off. An input rectifier/filter circuit 32 is connected to the half-bridge transformer 16 and converts the working voltage into a high-voltage DC current before the AC current enters the half-bridge transformer 16. The MOSFET unit 12 performs energy conversion on the high-voltage DC current, and the converted energy is processed and then output by the output rectifier/filter circuit 18.

In the present invention, the PWM controller 20 provides a control signal, such as a small duty-cycle signal waveform. The totempole amplifier circuit 22 amplifies the small duty-cycle signal, and the separating element 14 receives the amplified signal and converts the voltage of the signal. The converted signal is used to drive the MOSFET unit 12 and further voltage-converted by the half-bridge transformer 16. Then, the output rectifier/filter circuit 18 processes the signal output by the half-bridge transformer 16 to provide voltages for the external loads. Such a circuit is usually used in a domestic power supply or a personal computer; therefore, the control signal is first transferred from the secondary side to the primary side, and then from the primary side back to the secondary side. Thus, the present invention is characterized in that the feedback controls of the output voltage are all on the secondary side.

For reducing circuit area, the totempole amplifier circuit 22 and the PWM controller 20 are integrated in a single chip. Alternatively, the totempole amplifier circuit 22, the protection circuit 24, the information-timing control circuit 26 and the PWM controller 20 may be integrated in a single chip. Thereby, the complexity and cost of circuit is reduced, and the production efficiency and product quality is promoted.

Figure 3:
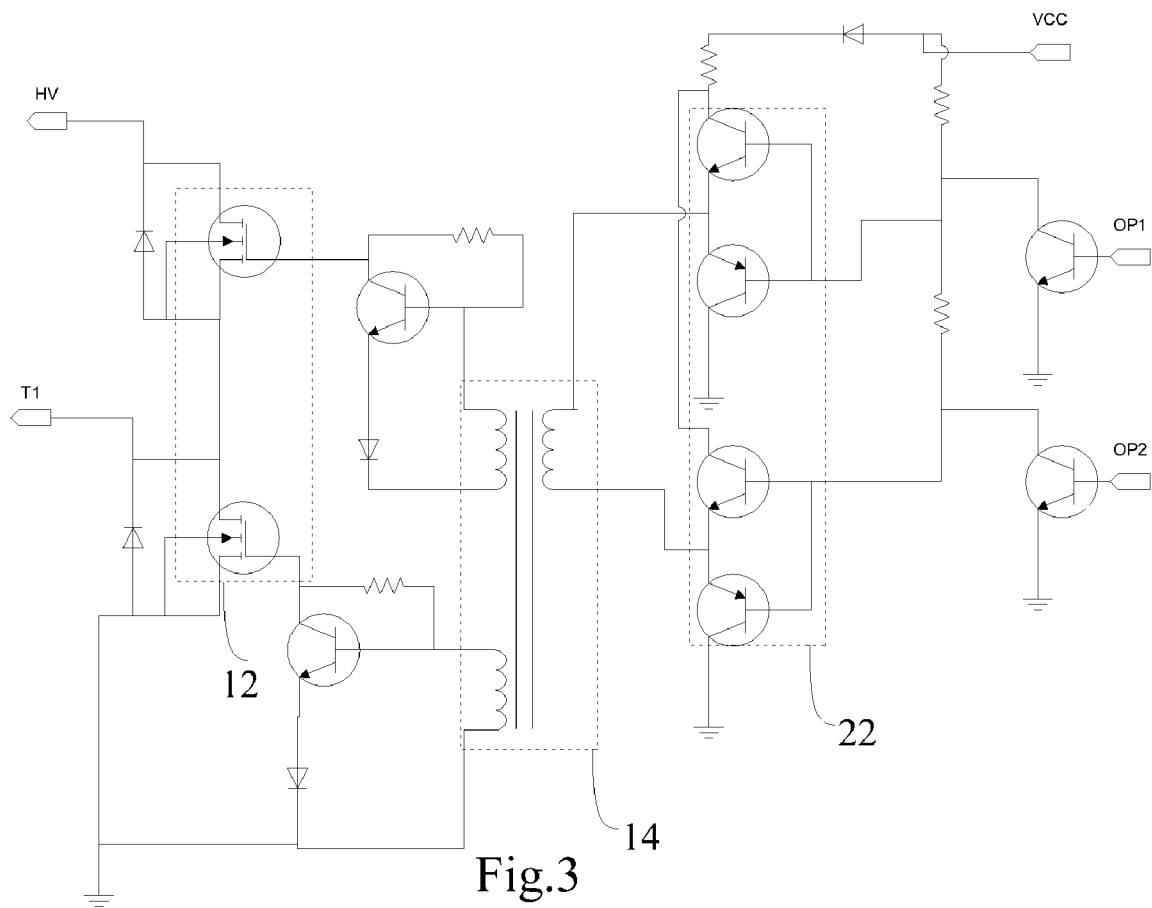
FIG. 3 is a diagram schematically showing a drive circuit for a power supply according to the present invention.

Refer to FIG. 3 a diagram schematically showing a drive circuit for a power supply according to the present invention. The drive circuit of the present invention comprises: a totempole amplifier circuit 22, a separating element 14 and a MOSFET unit 12. The MOSFET unit 12 may be formed of two MOSFETs. The totempole amplifier circuit 22 can amplify the control signal before the separating element 14 receives the control signal. A low voltage should be converted into a high voltage before the separating element 14 can drive the MOSFET unit 12. The totempole amplifier circuit 22 is used to make the separating element 14 able to provide sufficient instant current for the input capacitor Ciss, which is used to drive the MOSFET unit 12. Thus, the MOSFETs can be driven much more easily. Unlike the bipolar junction transistor, MOSFET does not have any transistor area and will not have too much switching loss during power conversion. Besides, as MOSFETs are voltage-operated components, it is easier for MOSFETs to increase the switching frequency of the power supply to over MHz. Further, as the half-bridge power source circuit can work in the first and third quadrants, the conversion efficiency can reach as high as 80% easily. The MOSFET unit 12 may be formed of a P-channel field effect transistor and an N-channel field effect transistor, or two P-channel field effect transistors, or two N-channel field effect transistors.

Figure 4:
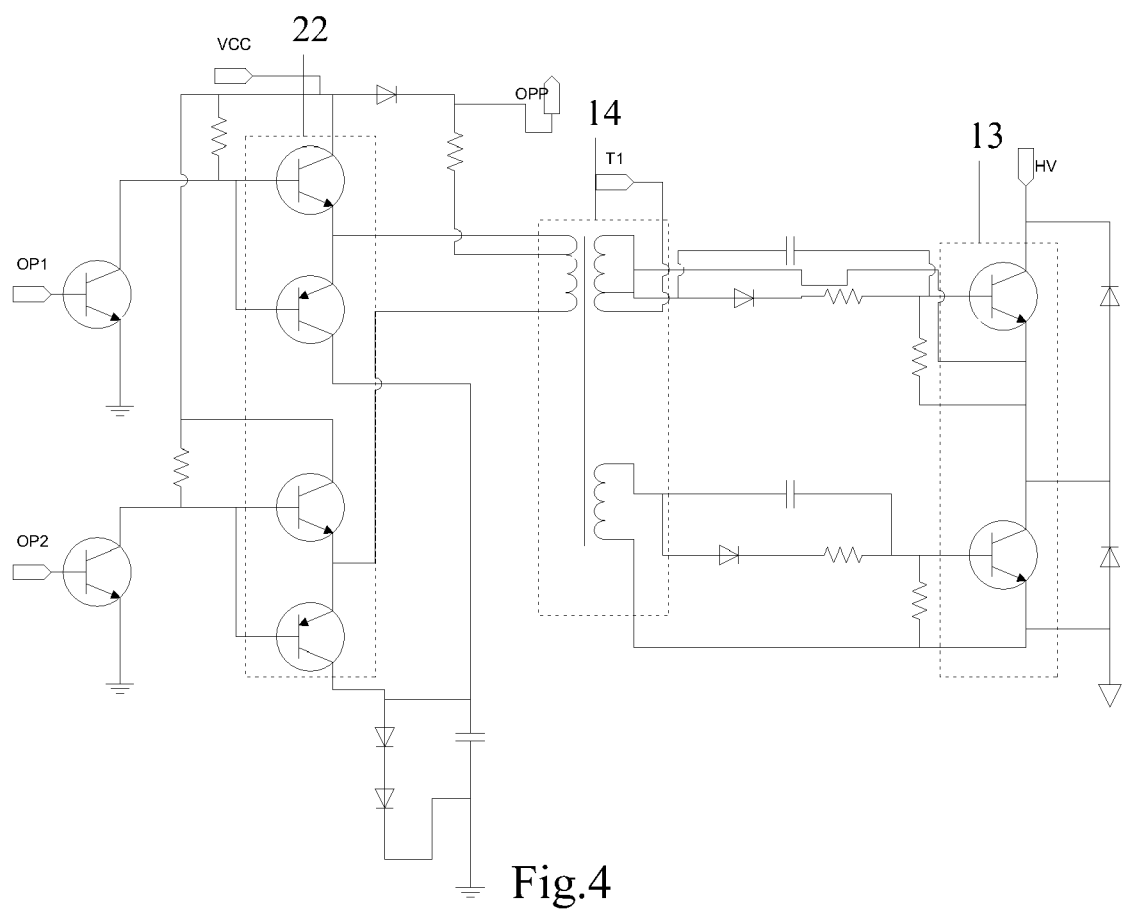
FIG. 4 is a diagram schematically showing another drive circuit for a power supply according to the present invention.
Figure 5:
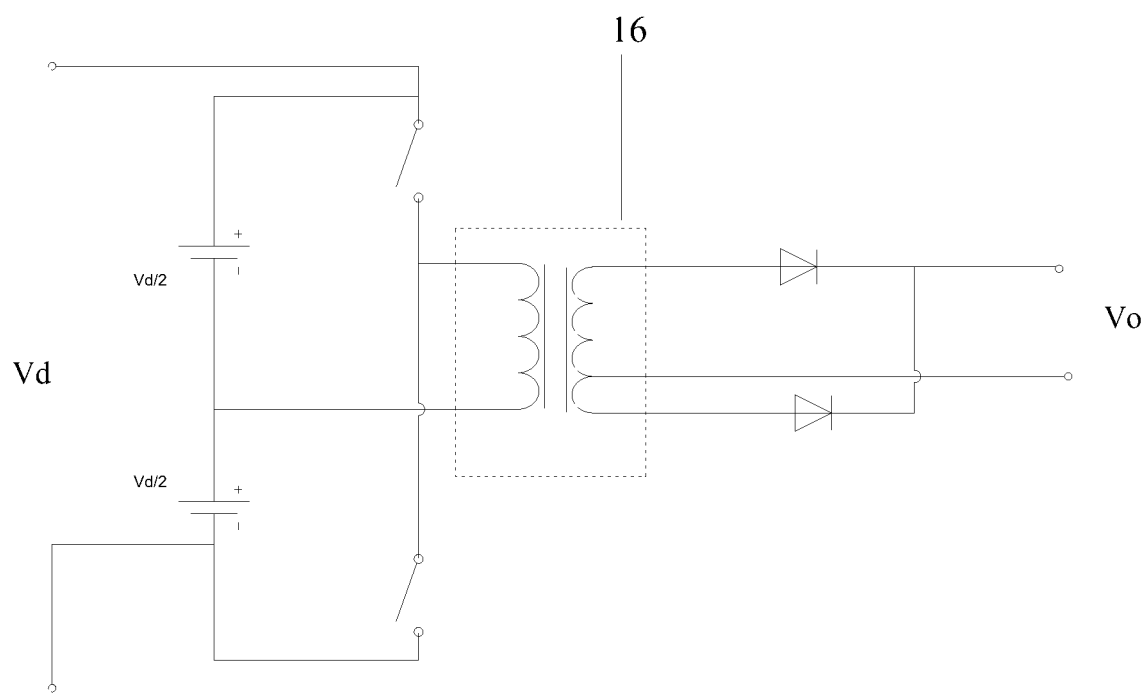
FIG. 5 is a diagram schematically showing a half-bridge power source circuit according to the present invention.
Figure 6:
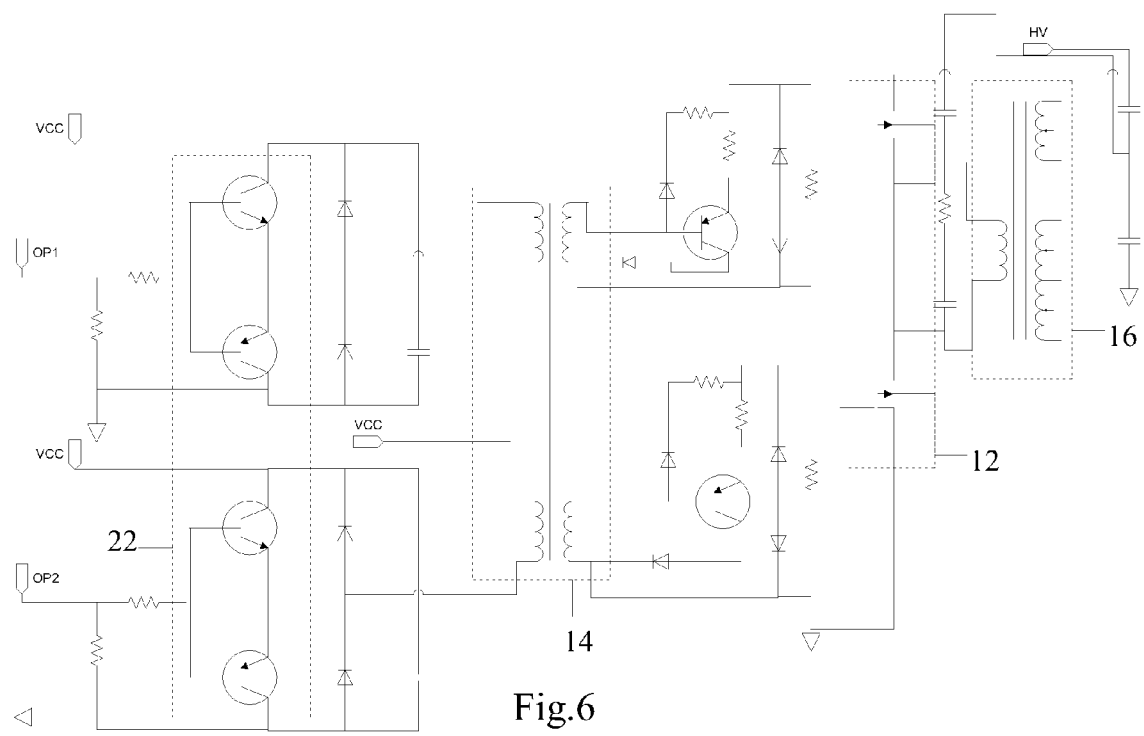
FIG. 6 is a diagram schematically showing a circuit wherein a half-bridge power source circuit and a drive circuit thereof are integrated according to the present invention.
Figure 7:
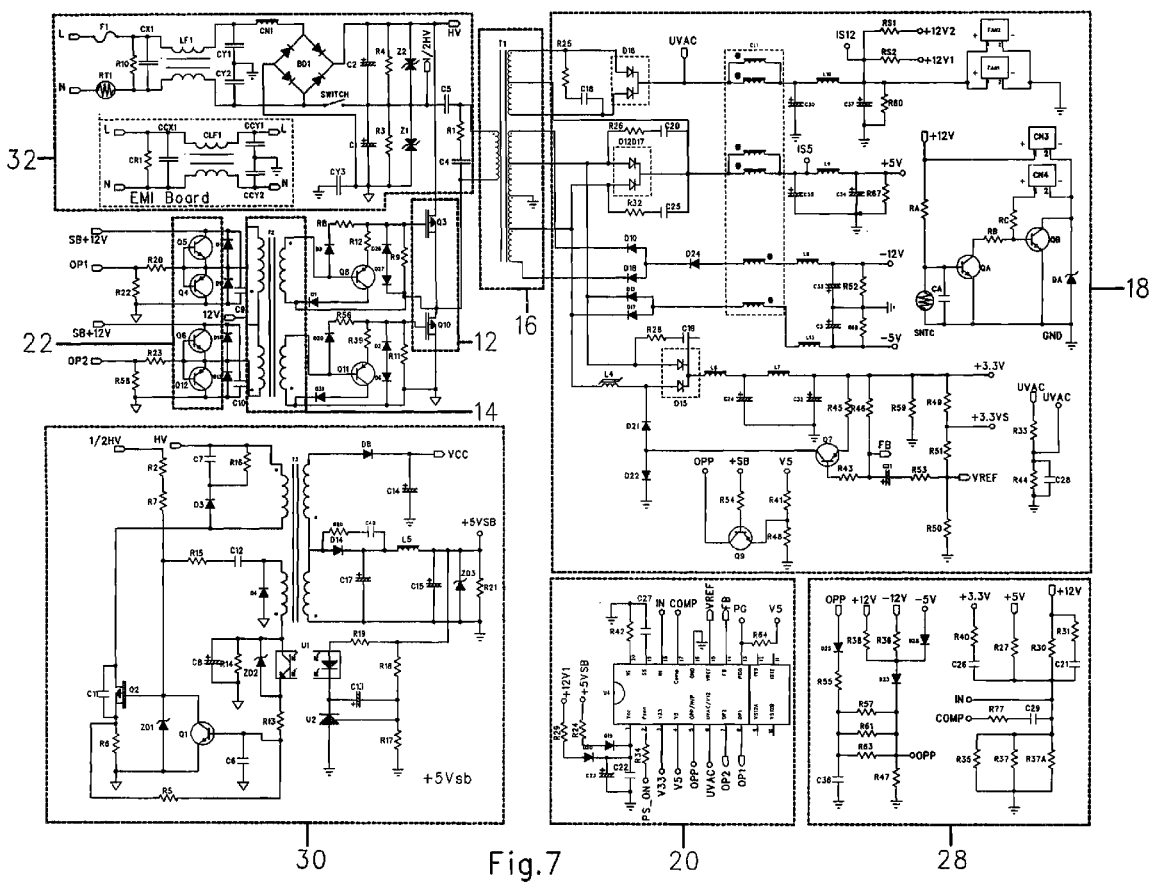

Refer to FIG. 4 a diagram schematically showing another drive circuit for a power supply according to the present invention. In this embodiment, a bipolar junction transistor unit 13 replaces the MOSFET unit 12. The bipolar junction transistor unit 13 is formed of two bipolar junction transistors, such as a PNP transistor and a PNP transistor, or two NPN transistors, or two PNP transistors. Refer to FIG. 5 a diagram schematically showing a half-bridge power source circuit according to the present invention. Also refer to FIG. 6 a diagram schematically showing a circuit wherein a half-bridge power source circuit and a drive circuit thereof are integrated according to the present invention. As the MOSFET unit 12 is responsible for performing a driving activity in a positive or negative semi-period, the operation of the power source circuit makes the half-bridge transformer 16 able to work in the first and third quadrants. Thus, the efficiency of the power supply can be promoted furthermore.

In the conventional power supply technologies, important circuits are often arranged on the primary side and are likely to be damaged by the high-voltage noise or abnormal conditions. Contrarily, the present invention integrates important circuits in an IC (such as the PWM controller, the protection circuit and the information-timing control circuit) and arranges the IC on the secondary side, which can prevent the important circuit from being damaged. Further, the present invention adopts MOSFET, which can reduce power loss and increase the switching frequency of the power supply. Besides, the shortage of MOSFET is less likely to occur in the present environment, and the administration of fabrication and cost is thus easier.

The preferred embodiments described above are only to exemplify the present invention but not to limit the scope of the present invention. Any equivalent modification or variation according to the characteristics or spirit of the present invention is to be also included within the scope of the present invention.

What is claimed is:

1. A secondary side-driven half-bridge power supply comprising:
    a half-bridge transformer having a primary side and a secondary side;
    a MOSFET (Metal Oxide Semiconductor Field Effect Transistor) units being connected to said half-bridge transformer, arranged on said primary side, and used to drive said half-bridge transformer;
    a PWM (Pulse Width Modulation) controller connected to said secondary side and generating a control signal;
    a separating element separating said secondary side from said primary side, connected to said PWM controller and said MOSFET unit, and receiving said control signal to drive said MOSFET unit;
    said separating element converts a low voltage into a high voltage to drive said MOSFET unit; and
    an output rectifier/filter circuit connected to said half-bridge transformer, arranged on said secondary side, and outputting voltages to external loads.

2. The secondary side-driven half-bridge power supply according to claim 1, further comprising a totempole amplifier circuit, which amplifies said control signal before said separating element receives said control signal.

3. The secondary side-driven half-bridge power supply according to claim 2, wherein said totempole amplifier circuit and said PWM controller are integrated in a single chip.

4. The secondary side-driven half-bridge power supply according to claim 1, wherein said PWM controller further comprises: a protection circuit and an information-timing control circuit.

5. The secondary side-driven half-bridge power supply according to claim 1, wherein said MOSFET unit includes at least two MOSFETs.

6. The secondary side-driven half-bridge power supply according to claim 5, wherein when said MOSFET unit is formed of MOSFETs, said MOSFET unit is formed of a P-channel field effect transistor and an N-channel field effect transistor, or two P-channel field effect transistors, or two N-channel field effect transistors.

7. The secondary side-driven half-bridge power supply according to claim 1, wherein said MOSFET unit is responsible for performing a driving activity in a positive semi-period or a negative semi-period.

* * * * *